United States Patent [19]

Gasser et al.

[11] Patent Number: 5,063,173

[45] Date of Patent: Nov. 5, 1991

[54] METHOD FOR MIRROR PASSIVATION OF SEMICONDUCTOR LASER DIODES

[75] Inventors: Marcel Gasser, Zurich; Ernst E. Latta, Adliswil, both of Switzerland

[73] Assignee: International Business Machines Corporation, Armonk, N.Y.

[21] Appl. No.: 538,626

[22] Filed: Jun. 15, 1990

[30] Foreign Application Priority Data

Oct. 10, 1989 [EP] European Pat. Off. ............ 89810668

[51] Int. Cl.$^5$ .......................................... H01L 21/203
[52] U.S. Cl. ............................ 437/129; 148/DIG. 95; 148/DIG. 65
[58] Field of Search ............... 437/129; 148/DIG. 95, 148/DIG. 65

[56] References Cited

U.S. PATENT DOCUMENTS

| 4,612,211 | 9/1986 | Hawrylo et al. | 427/86 |
| 4,656,638 | 4/1987 | Tihanyi et al. | 372/49 |
| 4,933,302 | 6/1990 | Costrini | 148/DIG. 95 |

FOREIGN PATENT DOCUMENTS

| 0381521 | 8/1990 | European Pat. Off. | |
| 3006949A1 | 2/1980 | Fed. Rep. of Germany | |
| 3711615A1 | 10/1987 | Fed. Rep. of Germany | |
| 198682 | 12/1982 | Japan | 437/129 |

OTHER PUBLICATIONS

D. K. Ferry, *Gallium Arsenide Technology*, vol. 2 (1984), Howard W. Sams & Co., Carmel, Ind.; pp. 420-422 and 426-431.

K. Asakawa & S. Sugata, "GaAs and AlGaAs Anisotropic Fine Pattern Etching Using a New Reactive Ion Beam Etching System", J. Vacuum Science Technology B, 3(1), Jan./Feb. 1985, pp. 402-405.

European Search Report EP 89 81 0668.

IEEE Transactions on Electron Devices, vol. ED-34, No. 11, Nov. 1987, pp. 2378-2379, Uchida et al., "Novel AlGaAs Laser with High-Quality Mirror Fabricated by Reactive Ion-Beam Etching and In-Situ Passivation Using Enclosed UHV Processing System".

*Primary Examiner*—Brian E. Hearn
*Assistant Examiner*—Linda J. Fleck
*Attorney, Agent, or Firm*—Donald M. Boles

[57] ABSTRACT

A method for passivating mirrors in the process of fabricating semiconductor laser diodes is disclosed. Key steps of the method are: (1) providing a contamination-free mirror facet, followed by (2) an in-situ application of a continuous, insulating (or low conductive) passivation layer. This layer is formed with material that acts as a diffusion barrier for impurities capable of reacting with the semiconductor but which does not itself react with the mirror surface.

The contamination-free mirror surface is obtained by cleaving in a contamination-free environment, or by cleaving in air, followed by mirror etching, and subsequent mirror surface cleaning. The passivation layer consists of Si, Ge or Sb.

7 Claims, 3 Drawing Sheets

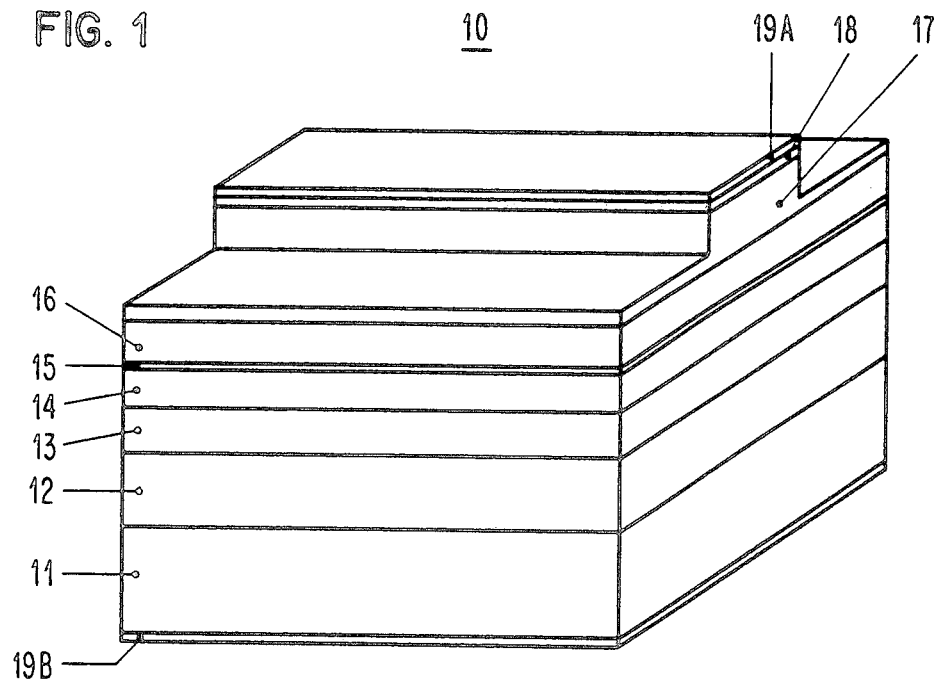

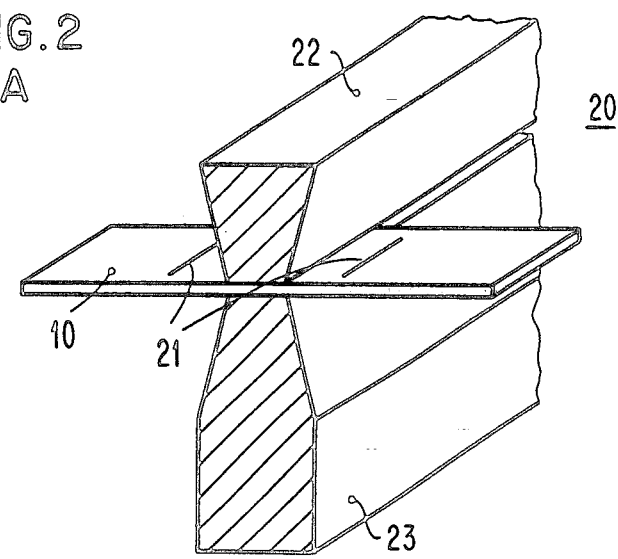
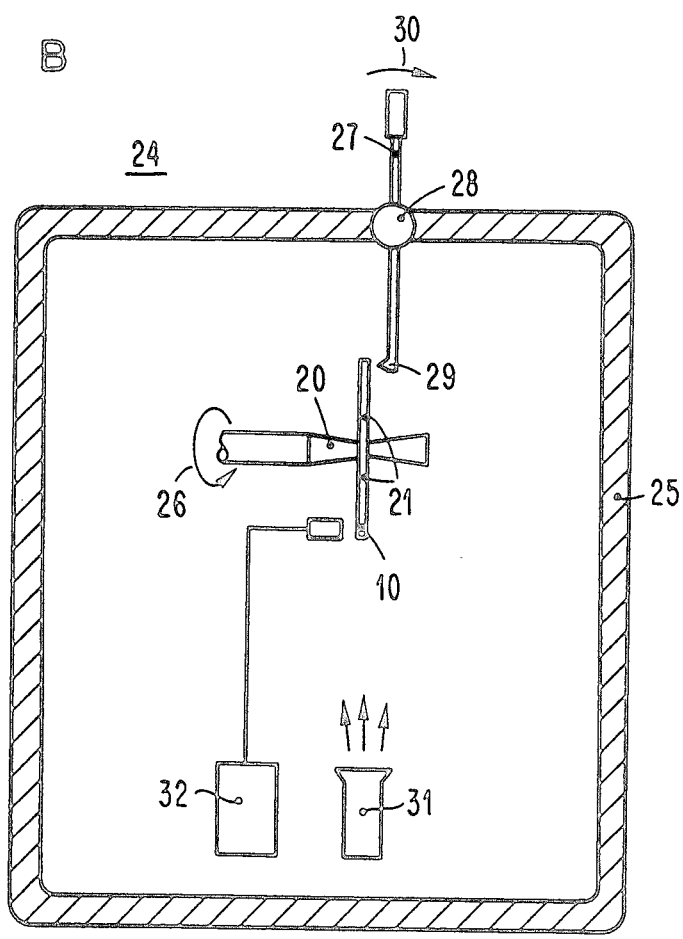

METHOD FOR MIRROR PASSIVATION OF SEMICONDUCTOR LASER DIODES

DESCRIPTION

1. Field of the Invention

The invention concerns a method for passivating mirrors of semiconductor laser diodes to avoid device performance degradation due to mirror contamination. According to the inventive method, which is applicable to cleaved and etched mirror devices, a passivation layer of suitable material is deposited "in-situ" on contamination-free mirror facets.

2. Background of the Invention

Semiconductor laser diodes have found applications in a wide variety of information handling systems because of their compact size and because their technology is compatible with that of the associated electronic circuitry. They are being used in areas related to data communication, optical storage and optical printing. Most commonly used are group III/V compounds and alloys of which, particularly, AlGaAs lasers have found extensive usage.

Historically, mirror facets have been obtained by cleaving laser bars, i.e, layered structures forming the active waveguide of the device. Cleaving usually provides single devices that require individual processing and testing. More recently, a strong trend has developed to increase the scale of integration that requires replacement of at least one cleaved mirror facet of the laser diodes by an etched mirror. This technology appears promising, since substantial progress has been made in obtaining good quality etched mirrors. Processes such as mirror coating and testing can now be performed at the wafer level with the benefit of reduced handling, increased yield, and lower fabrication and testing costs.

Reliability and thus maximum lifetime of a device is one of the most important and critical criteria for both types of lasers, i.e., for those with cleaved and for etched mirrors. These factors are heavily affected by mirror contamination and degradation which lead to device heating and, ultimately, device destruction.

For more than a decade, proposals and attempts have been made to solve these problems. Most successful among the proposed solutions has been coating the mirror facets with passivation layers which are applied to protect the mirror surfaces against contamination. Some of these approaches, illustrating the development of the passivation techniques and representing the present state of the art, are described in the following publications:

Article "Effects of facet coatings on the degradation characteristics of GaAs-GaAlAs DH lasers" by Y. Shima et al (Appl. Phys. Lett., Vol. 31, No. 9, No. 1, 1977, pp 625-627), probably contains the first discussion of the influence of facet coating on AlGaAs laser degradation. The authors achieved drastic improvements in slowing degradation rates and maximum power output by covering cleaved mirrors with $Sio_2$ or $Al_2O_3$. For $Al_2O_3$, an optimum degradation rate of about $-0.001$/hour at 2 mW/$\mu$m light output was obtained.

Article "Insulating carbon coating on (AlGa)As DH laser facets" by T. Furuse et al (Appl. Phys. Lett., Vol. 44, No. 4, 15 Aug. 1978, pp 317-318), reports on a further improvement of the degradation rate by applying a carbon coating. The authors report stable lasing operations at 4 mW for over 6000 hours.

Article "High-power-density single-mode operation of GaAs-GaAlAs TJS lasers utilizing $Si_3N_4$ plasma deposition for facet coating" by H. Namizaki et al (J. Appl. Phys. 50(5), May 1979, pp 3743-3745), describes a method of laser diode facet coating involving plasma deposition of $Si_3N_4$ onto the mirror surface. It was found that, after 1000 hours of operation at 4mW/$\mu$m, little change in the operating current occurs.

Article "Pulsed-power performance and stability of 800 nm GaAlAs/GaAs oxide-stripe lasers" by F. Kappeler et al (IEE Proc., Vol. 129 pt. 1, No. 6, Dec. 1982, pp 256-261), reports experimental results and theoretical investigations of AlGaAs/GaAs lasers under pulsed power conditions. The authors used $Al_2O_3$ coated mirrors and applied an argon ion sputter process for precleaning the mirror facets prior to deposition of the passivation. No improvement of the maximum obtainable output was reported; in fact, high-energy sputtering, causing surface defects, seems to have had a negative effect.

Article "Reactive outdiffusion of contaminants from (AlGa)As laser facets" by P. Tihanyi et al (Appl. Phys. Lett., Vol. 42, No. 4, Feb. 15, 1983, pp 313-315), describes a different approach for precleaning mirror surfaces. The authors deposited a thin, metallic Al film directly on the air-cleaved facet and claim that the process eliminated a large part of surface contaminations due to gettering of the Al.

Article "High-power 0.87 micron Channel Substrate Planar Lasers for Spaceborne Communications" by J. C. Connolly et al (SPIE 885 Free-Space Laser Communication Technologies, 1988, pp 124-130), represents state of the art high performance AlGaAs lasers. Passivation was obtained by optimizing $Al_2O_3$ deposition techniques. The device allowed single mode operation up to about 200 mW, at which point, immediate catastrophic optical damage occurred. In lifetests at 50 mW (50% duty-cycle) and at room temperature, devices have operated over 5000 hours with little or no change in drive current. No lifetime date are reported for higher power levels (but below 200 mW).

At present, high performance lasers still suffer from a number of deficiencies:

Continuous operation output power above 200 mW is still not possible for an extended period of time;

For operation at about 50 mW continuous output power, the lowest degradation rates achieved ranges from $10^{-5}$ and $10^{-6}$ per hour, i.e., the device lifetime is still limited; and Devices undergo a "burn-in" phase during which the output power shows a substantial decrease until the slow degradation phase is reached at approximately 100 hours of operating time.

As demonstrated by the above cited publications, various processes have been suggested for passivating mirror surfaces. However, no reference has been made in the art to disclose or suggest an in-situ deposition of a passivation layer on a contamination-free mirror surface, a process found to provide superior results and used in the process described hereinafter.

Although many materials have been suggested for mirror passivation, it is not known by those versed in the art of using Si, Ge or Sb for this purpose, as it is proposed in the present invention. Si has been widely used in the fabrication and design of other GaAs technology devices. By way of example, a MOS transistor fabrication process disclosed in the article "Unpinned GaAs MOS Capacitors and Transistors" by S. Tiwary et al (IEEE Electron Device Letters, Vol. 9, No. 9, Sept. 1988, pp 488–490) uses an extremely thin MBE-grown Si terminating layer that is applied to the GaAs transistor channel surface during an intermediate process step. In a subsequent chemical $SiO_2$ deposition, the Si layer is consumed into the oxide film, as required for proper operation of the MOS device.

Accordingly, it is a main object of the present invention to provide a method for fabricating high-power, long life, high performance diode lasers.

Another object is to provide a method for depositing passivation layers to provide effective protection to laser mirrors against contamination, thereby avoiding early device deterioration.

A further object is to provide a diode laser structure with a passivation layer applied to the mirror facets, effectively preventing mirror degradation and, thus, providing a high-power, high-reliability device.

SUMMARY OF THE INVENTION

The invention as claimed is intended to meet the aforementioned objectives. The inventive method solves the problems previously encountered in that a contamination-free mirror facet is provided with a continuous, insulating (or low conductive) passivation layer, applied "in-situ". The passivation layer is formed with material that effectively prevents the diffusion of impurities capable of reacting with the mirror facet interface, but not with the mirror itself, in an environment that does not contain oxygen. In a preferred embodiment, Si is used. Other suitable materials are Ge and Sb.

The main advantage offered by the invention are that semiconductor laser diodes fabricated in accordance with the inventive process exhibit substantially improved degradation behavior, resulting in very high power lasers of superior reliability and, thus, increased lifetime. In addition, these lasers, when in operation, do not undergo an initial, fast degradation "burn-in" phase as is the case in the prior art.

DESCRIPTION OF THE DRAWINGS

The invention is described in detail below with reference to drawings which illustrate a specific embodiment including performance characteristics of devices fabricated in accordance with the teaching of the invention, and in which:

FIG. 1 is a perspective view of a laser bar consisting of a ridge GRINSCH structure according to the inventive method of forming contamination-free mirrors followed by in-situ passivation;

FIG. 2 is a schematic representation of a vacuum chamber in which the contamination-free laser mirror facets are formed and passivated;

DESCRIPTION OF THE PREFERRED EMBODIMENT

Figure 3:
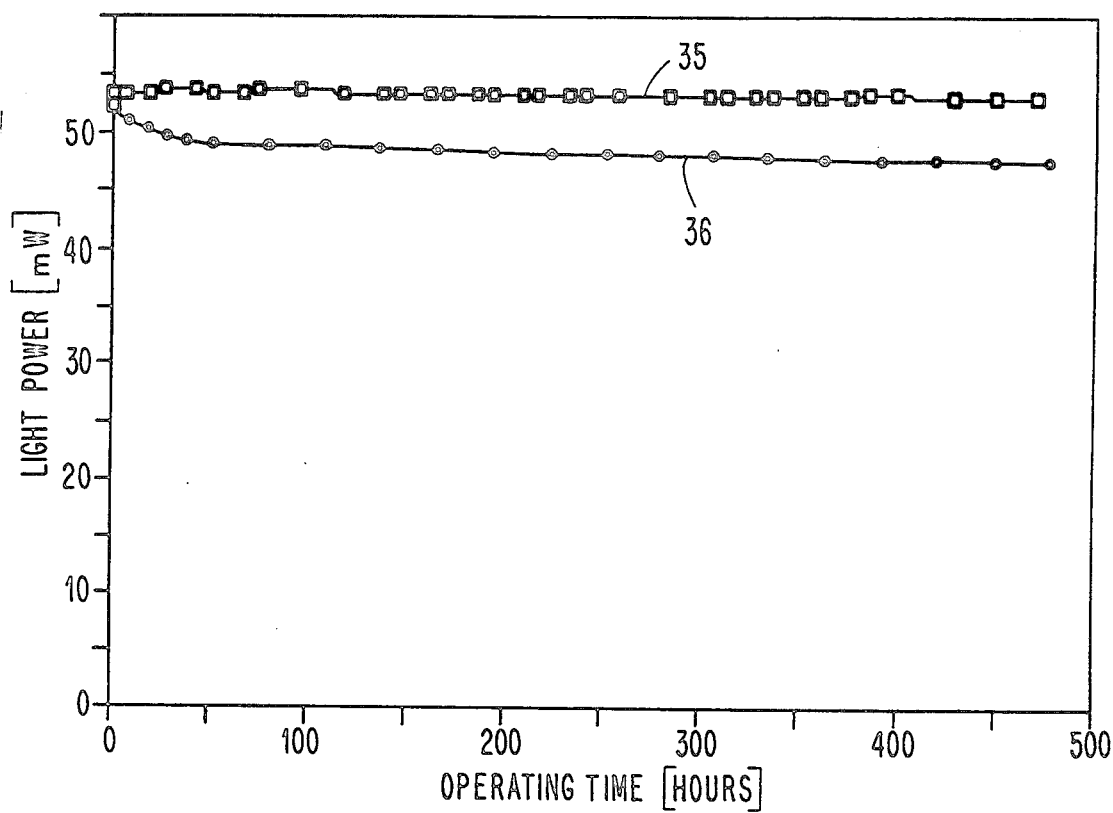
FIG. 3 shows laser power degradation curves of cleaved mirror lasers with (1) a 20 nm Si passivation, and (2) a conventional $Al_2O_3$ coating.

Before describing the invention in greater detail, the purpose and basic concept underlying the invention will be briefly outlined by referring to the experiences and problems encountered with hitherto known processes and devices.

Important steps in the fabrication process of AlGaAs (or other III/V compound) laser diodes are the preparation of the mirrors, conventionally by cleaving and, recently, also by etching and subsequent passivation. The standard procedure has been to cleave the laser bar (i.e., the layered structure forming the laser waveguide) in air, and to quickly transfer it to a vacuum system where a protective passivation layer is deposited onto the mirror facets. The purpose of this layer is twofold: (1) to protect the mirror surfaces against corrosion and, (2) to reduce the number of electrical surface traps resulting from crystal defects. Both effects are responsible for the dissipation of energy occurring during laser operation. This eventually could lead to mirror degradation and even to irreversible catastrophic damage to the device caused by excessive heating of the facets. Despite the application of passivation layers, the lifetime of presently known lasers is limited by those degradation mechanisms. Typical light output versus operating time diagrams, (at constant current applied to the laser), shows an initial fast decrease—the so-called "burn-in" phase—and a normally long phase of smaller degradation rate with a nearly constant slope.

As previously stated, the passivation layer prevents interaction of the AlGaAs with the surrounding atmosphere, while the laser is in operation. There is no protection against impurities already present on the mirror surface during passivation while the mirror is exposed to air. Contamination of the AlGaAs-coating interface is therefore unavoidable.

A first important aspect of the present invention is to provide a contamination-free mirror facet during passivation while maintaining the laser in a contamination-free atmosphere. For cleaved mirror devices, this can be accomplished by cleaving and depositing a protective layer "in-situ" in a vacuum system with adequate low base pressure. The same principle applies to etched laser devices. After completion of the cleaning process leading to a contamination-free surface, the etched mirror facets are coated in-situ with a protective layer. The applied protective layer can either be the final passivation layer or a thin layer that protects the AlGaAs surface until an additional thicker layer is deposited, possibly in a different environment.

A second important aspect of the invention is the choice of an appropriate material for passivation. Materials presently used, such as $SiO_2$ and $Al_2O_3$ do not achieve the desired performance. The passivation layer must act as a diffusion barrier to those impurities that normally react with AlGaAs and must not react with the material of the mirror itself. Since Al, Ga and As form stable oxides, oxygen, OH, or even $H_2O$ should not be near the laser mirror. Consequently, oxides are not preferred.

Another requirement is that the conductivity of the passivation layer be sufficiently low to avoid significant currents across the mirror facet. This precludes using highly conductive materials, such as metals, unless the layers are made very thin. Additionally, the material must form a continuous layer without pinholes and pores. Tests indicate that the best results are obtained with Si. Ge and Sb can also be favorably used as passivation materials.

Following is a detailed description of an example according to the inventive method in which a passivation layer is deposited on a cleaved mirror facet.

First, a laser bar is made by means of an epitaxially grown layered structure forming a waveguide. This waveguide serves as the laser cavity when both ends are terminated with a mirror facet (see FIG. 1). This structure may be the same as manufactured by the process described in an article by C. Harder et al, entitled "High-Power Ridge-Waveguide AlGaAs GRINSCH Laser Diode", published in the Electronics Letters of Sept. 25, 1986, Vol. 22, No. 20, pp 1081-1082 which is specifically incorporated by reference herein. Briefly, the sequence of steps for producing the layered structure 10 is as follows:

Layers 12 through 17 are thoroughly grown on an n+ doped GaAs substrate 11 by, e.g., molecular beam epitaxy (MBE). An n-doped GaAs buffer layer 12 is grown on substrate 11 followed by a lower n-type cladding layer 13 (0.2 $\mu$m $Al_{0.45}Ga_{0.55}As$). The core of the laser consists of a graded n-type region 14 (0.2 $\mu$m $Al_{0.45}Ga_{0.55}As$ graded towards $Al_{0.18}Ga_{0.82}As$), an undoped region 15 forming a quantum well (7 nm GaAs), a graded p-type region 16 (0.2 $\mu$m $Al_{0.45}Ga_{0.55}As$) and, finally, a p+ −GaAs contact layer 18 with doping density sufficiently high to allow a titanium-platinum-gold electrode 19A to make good ohmic contact. A second ohmic contact 19B at the bottom of the n-type substrate 11 is obtained by alloying germanium, gold and nickel.

A ridge, about 5 $\mu$m wide, can be formed on top of the structure (as shown in FIG. 1) in order to act as a lateral waveguide prior to applying the metal contact electrodes. This ridge is obtained by first applying a photoresist mask to define the ridge. Subsequently, 1 or 2 $\mu$m of the exposed top layers are etched, and the etching is stopped 0.2 $\mu$m above the graded-index part of the top cladding layer.

Further processing of laser bar 10 will now be described by means of the schematic of FIG. 2. Bar 10, with a length of a few millimeters, is scratched to provide two scribe lines 21, 750 $\mu$m apart. They define the positions where cleaving and mirror formation are to take place. Bar 10 is mounted on a carrier 20, as shown in FIG. 2A and is held by an upper (22) and a lower (23) member that apply (through a mechanism not shown) gentle pressure sufficient to keep the bar in place during subsequent process steps.

The carrier 20, with the laser bar 10 mounted on it, are placed in a vacuum system 24, as illustrated in FIG. 2B. System 24 comprises a (UHV) ultra high vacuum chamber 25 of which only the outer walls are shown. Omitted, for simplicity sake are the inlets and outlets, the electrical connections, etc. Carrier 20 is placed in the chamber so that it can easily be handled from outside. For example, it can be rotated around the horizontal axis, as shown by arrow 26. The chamber is also equipped with a lever or "wobble stick" 27, entering the chamber through a metal bellow 28 allowing mechanical movement of the tip 29 to take place within the vacuum chamber. With the relative position between lever 27 and bar 10 maintained as shown, a movement of the outer arm of the lever to the right (arrow 30) allows tip 29 to apply a force on the upper end of laser bar 10.

An E-beam evaporation source 31 for Si deposition and a quartz-crystal oscillator 32 for monitoring the thickness of the deposited layer during E-beam evaporation are provided in chamber 25. The vacuum system, the evaporation source and the crystal oscillator operation will not be described in detail since they are well known in the art. Reference is made to a "Handbook of Thin Film Technology", edited by L. I. Maissel and R. Glang (McGraw-Hill, 1970) for additional details.

The sequence of steps required in the process of cleaving and passivation for a system shown in FIG. 2B is as follows:

The carrier 20 is placed in the chamber 25 with laser bar 10 and the chamber pressure is reduced to about $5 \times 10^{-8}$ Pa. (The next process steps can be carried out at room temperature).

Moving the end of lever 27 extending outside the chamber to the right, causes tip 29, located near the upper end of the laser bar 10, to move to the left. This causes the end of the bar to break at scribe line 21, thereby forming the first mirror facet.

After turning carrier 20 by 180 degrees about its horizontal axis, the same process is repeated, resulting in breaking off of the second laser bar end at the second scribe line, thus forming the second mirror facet.

Activating the E-beam evaporation source 31 causes deposition of an amorphous silicon layer on the exposed mirror facet facing the source. The evaporation process is terminated when the layer, monitored by crystal oscillator 32, reaches the desired thickness, e.g. 20 nm. By adjusting the electron acceleration voltage, the evaporation rate can be set so that the deposition process takes about one minute.

After turning carrier 20 again by 180°, the same evaporation process is repeated, resulting in deposition of a silicon layer on the second mirror facet.

This last process step completes the passivation coating and the laser element is ready for use.

FIG. 3 illustrates how laser power degrades with device operating time, for a laser that uses the aforementioned process. Compared are 1) a laser with a Si passivation layer 20 nm thick (curve 35); and 2) a conventional, state of the art, $Al_2O_3$ coated laser (curve 36).

Curve 35 shows the output power of a Si-passivated laser where a constant laser current (168 mA) was applied at room temperature for 500 hours. Curve 36 represents the measurement of a virtually identical laser, except that a conventional $Al_2O_3$ coating is applied instead of Si Passivation.

The superior performance of the Si-coated device represented by curve 35, is evident: (1) there is virtually no burn-in phase, i.e., the laser is ready for immediate use after fabrication, and (2) the degradation rate can be as low as $8.4 \times 10^{-7}$/hour. Testing the device was extended over 5000 hours, with little change in degradation rate.

It has been proven, particularly for high power devices, that reducing the Si-film thickness to about 1 nm requires, an additional thick protective coating. This coating may consist of $Si_3N_4$. For such lasers, extremely high light output power has been achieved, as may be determined from FIG. 4. Curve 41 represents the performance of a 5 $\mu$m ridge GRINSCH laser (as described in the cited article by C. Harder et al) with a 1 nm Si/140 nm $Si_3N_4$ passivation coating. A 300 mW output beam was maintained over 300 hours without measurable degradation.

Figure 4:
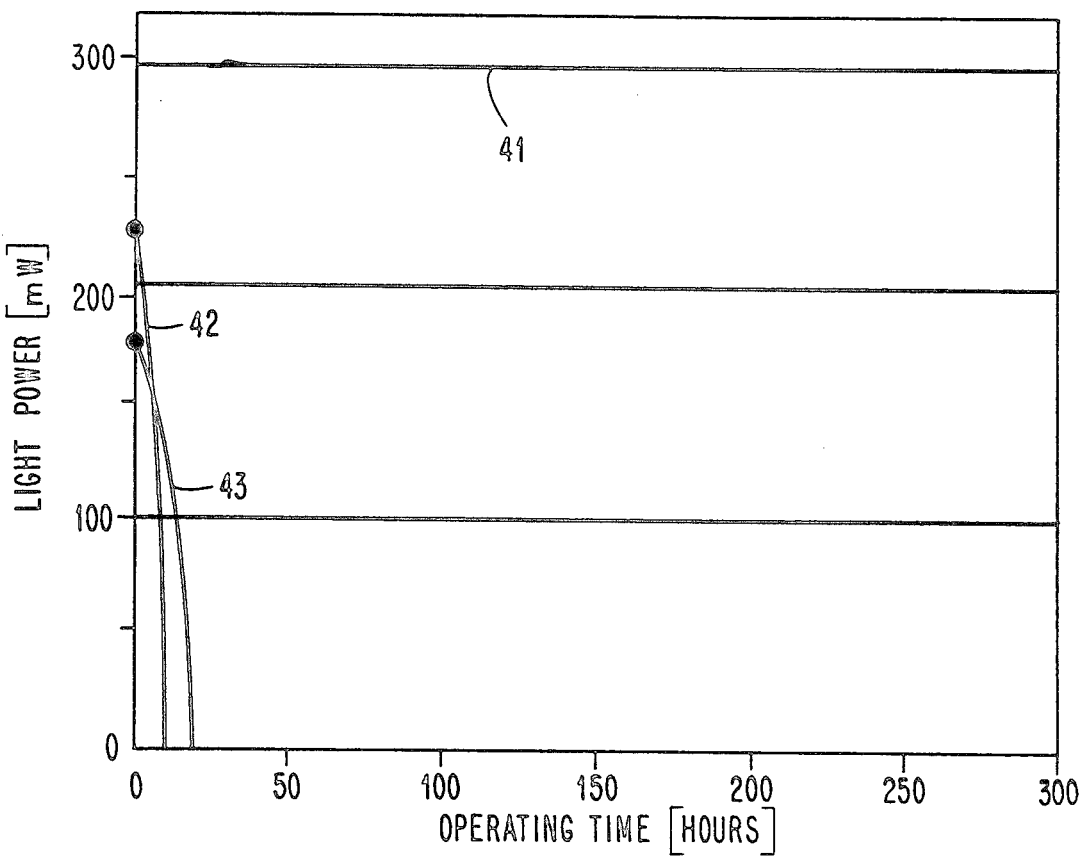
FIG. 4 shows a light power/operating time.

Still referring to FIG. 4, curves 42 and 43 represent two laser devices on the same wafer, both identical to the laser of curve 41, except that their passivation did not contain Si applied in-situ. The lasers are operated in a mode such that by applying laser currents results in an initial light output power of 220 and 180 mW, respectively. This output power quickly deteriorates with catastrophic optical damage occurring shortly thereafter.

This comparison illustrates the superior power-capabilities of the in-situ Si-passivated devices which allow continuous, long lasting operation at 300 mW, whereas the upper power limit for conventional devices is far below 150 mW.

Experiments have shown that lasers with mirrors protected by Ge or Sb layers, instead of Si, exhibit similar degradation behavior compared to that of Si passivated devices, provided the layers are deposited onto uncontaminated mirror facets.

The application of the Si-passivation concept in accordance with the present invention is not limited to cleaved mirror devices. Any uncontaminated and stoichiometric mirror face can likewise be protected. Dry etched mirror lasers are examples which may become increasingly important in the future since they allow full wafer processing and testing, i.e., passivation coatings can be simultaneously applied to all devices on the wafer.

A process for fabricating high power etched mirror lasers with a Si passivation coating in accordance with the present invention comprises the following preferred steps:

Fabrication of the basic layered laser structure (as described in the article by C. Harder et al);

Dry etching to create etched mirror facets (as described in European patent application 88.810613.5, filed on Sept. 12, 1988 and assigned to the present assignee) and which is specifically incorporated by reference herein; Sputter cleaning of the etched facets to remove residuals of the etching process, e.g., with nitrogen/hydrogen ions, at 800 V and at a pressure of 0.4 Pa, followed by annealing to remove surface defects;

In-situ E-beam evaporation, i.e., without breaking vacuum within the system, of a 2 nm Si passivation film, and Sputter deposition of $Si_3N_4$ films of various thicknesses onto the mirrors at both ends of the laser waveguide, providing coatings of high and low reflectivity, respectively.

The invention has been described in detail as applied to the fabrication of specific AlGaAs ridge diode lasers with either cleaved or etched mirrors. It should, however, be understood that it is likewise applicable to other laser diode structures, as well as to devices consisting of semiconductors other than AlGaAs. Also, the processes and device parameters may differ from those indicated hereinabove. For instance, Si layers may be epitaxially grown using an MBE process, their being crystalline rather than amorphous, and additional coatings may be deposited on the Si (or Ge, Sb), with materials other than $Si_3N_4$.

Accordingly, the present invention discloses:

A process of forming a contamination-free mirror surface, either by cleaving or by cleaning of etched mirror surfaces, and the subsequent mirror passivation executed in-situ in a contamination-free environment. The passivation layer must be continuous, either insulating or of low conductivity, and of a material that acts as a diffusion barrier for impurities capable of reacting with the mirror surface but which does not react with the mirror material. Suitable passivation materials are Si, Ge and Sb. Laser diode devices fabricated in accordance with the aforementioned method are less affected by "burn-in", show a significant improvement in lifetime and allow continuous operation at drastically increased output power levels in excess of 300 mW, at room temperature.

It is to be recognized that only an illustrative embodiment of the present invention is shown and that changes and modifications still within the spirit of the invention will immediately occur to those skilled in the art. The present invention then is to be limited only as set forth in the following claims.

What is claimed is:

1. A method for passivating semiconductor laser diodes, comprising the steps of:
   (a) providing a layered semiconductor structure forming the active waveguide of a laser diode;
   (b) processing said layered semiconductor structure in an environment free of contamination so as to provide contamination-free mirror facets in order to terminate said active waveguide and define the length of the laser diode cavity, and
   (c) depositing a passivation layer of material selected from a group comprised of silicon, germanium and antimony, in-situ onto said contamination-free mirror facets in said environment which is free of contamination.

2. A method as in claim 1, whereby said passivation layer is deposited onto a cleaved, contamination-free mirror facets while maintaining the laser diode structure in the same environment in which cleaving was performed.

3. The environment of claim 2 is further characterized to be a vacuum with a pressure below $10^{-6}$ Pa.

4. A method as in claim 1, whereby said contamination mirror facets are obtained by using a dry-etching process followed by plasma cleaning in a contamination-free environment.

5. A method as in claim 4, whereby said passivation layer is deposited onto said contamination-free mirror facets while keeping the laser diode structure in the same environment in which said plasma cleaning was performed.

6. A method as in claim 1, whereby said contamination-free mirror facets are obtained by a dry-etching process such that said passivation layer is deposited onto said contamination-free mirror facets while the laser diode structure remains in the same environment in which said dry-etching process was performed.

7. A method as in claim 4, whereby said plasma cleaning is followed by an annealing process to remove facet defects.

* * * * *